(12) United States Patent
Miyawaki

(10) Patent No.: US 6,225,693 B1
(45) Date of Patent: May 1, 2001

(54) SEMICONDUCTOR PACKAGE FOR RADIO FREQUENCY

(75) Inventor: Katumi Miyawaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/377,899

(22) Filed: Aug. 20, 1999

(30) Foreign Application Priority Data

May 12, 1999 (JP) .................................................. 11-131170

(51) Int. Cl.[7] ........................... H01L 23/06; H01L 23/10; H01L 23/15
(52) U.S. Cl. ........................... 257/703; 257/705; 257/779
(58) Field of Search ................................... 257/703, 705, 257/779

(56) References Cited

U.S. PATENT DOCUMENTS 6,001,673 * 12/1999 Marcinkiewicz .

FOREIGN PATENT DOCUMENTS 61-101052    5/1986   (JP) .

* cited by examiner

Primary Examiner—David E. Graybill
(74) Attorney, Agent, or Firm—McDermott, Will & Emery

(57) ABSTRACT

In a semiconductor package for radio frequency, slits arranged like dotted lines, elongated metallic plates, or rectangular dielectric members are provided on a surface for grounding of the package, on which a semiconductor element is mounted, whereby an area for grounding positioned just below the semiconductor element and areas in the surface for grounding of the package being in contact with wires for grounding are arranged with extremely short intervals to thereby substantially reduce components of inductance causing deterioration of radio frequency properties; and disconnections of the wires in the surface for grounding caused by extrusion of a jointing material 6 are prevented.

9 Claims, 5 Drawing Sheets

F I G. 8
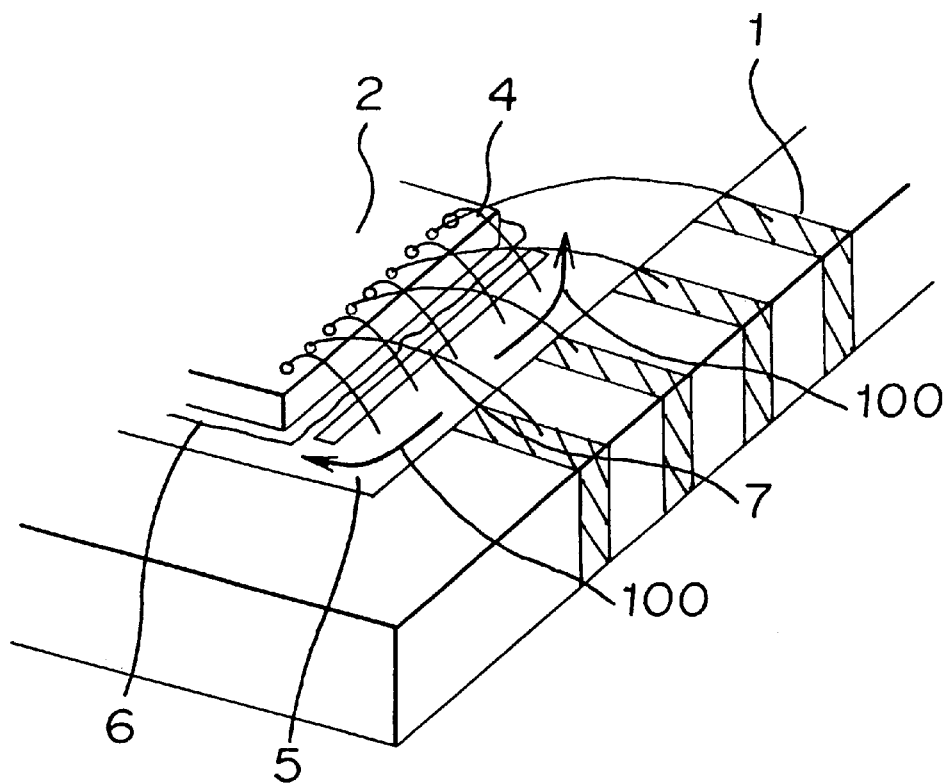

SEMICONDUCTOR PACKAGE FOR RADIO FREQUENCY

BACKGROUND OF THE INVENTION

1. Field of the Invention

The present invention relates to a package equipped with a semiconductor element operated with a low loss in radio frequencies (RF), which can be realized at a low cost.

2. Discussion of Background

In case that operating frequencies of semiconductor devices are increased, structures of joining a semiconductor element to a ground surface of a package and/or grounding the package itself are significant. Conventionally, so-called via hole is opened at a ground in a semiconductor element in a downward direction to connect a package with the ground, or a metallic package, specifically for a ground surface, is used to stabilize the ground surface.

However, in recent years, there is a tendency of pursuing low costs of these devices operating at high rates. Therefore, it becomes difficult to apply via holes and/or metallic packages to such semiconductor elements. Instead thereof, connections to grounds are being attained by bonding wires, or packages having ceramic bases are being used for secure groundings. When operating frequencies become 1 GHz or more, grounds themselves may have components of inductance (L) depending on bonding wires and/or arrangements of packages and ground surfaces, whereby properties of semiconductor are caused to be deteriorated.

FIG. 6 shows a conventional package structure. In FIG. 6, numerical reference 1 designates a ceramic package; numerical reference 2 designates a semiconductor element; numerical reference 3 designates an inner lead wire for electrically connecting an outer circuit to the semiconductor element; numerical reference 4 designates an Au wire; numerical reference 5 designates a ground area having a structure of metallizing a ceramic; numerical reference 6 designates a jointing material for connecting the semiconductor element 2 to the package 1; and numerical reference 7 designates an antirunning, being a pattern clipping the metallized ground area portion, for preventing the jointing material from flowing at a time of bonding the Au wires 4 between ground terminals of the semiconductor element 2 and the ground area 5 of package, wherein the wires are bonded on outer sides of the antirunning portions.

FIG. 7 is a cross-sectional view of this package, in which numerical reference 50 designates a grounding area positioned just below the semiconductor element 2 on plating of the package.

However, the conventional semiconductor package for radio frequency has problems that properties of the semiconductor element 2, specifically including a gain, were deteriorated because there were distances between a semiconductor element 2 and a metallized ground area 5 and between wire bonding and a ground surface just below the semiconductor element 2 and such distances of arrows 100 shown in FIG. 8 caused inductances of L components.

SUMMARY OF THE INVENTION

It is an object of the present invention to solve the above-mentioned problems inherent in the conventional technique and to provide a semiconductor package for radio frequency, in which grounds of a semiconductor element can be connected to a ground surface of the package by bonding wires within extremely short distances and/or a ground area positioned just below a semiconductor element to an area bonded to a ground surface of the package within extremely short distances, whereby components of inductance causing deterioration of radio frequency properties can be suppressed to be extremely small.

According to a first aspect of the present invention, there is provided a semiconductor package for radio frequency having a grounding surface which is connected to grounding electrodes of a semiconductor element by wires for grounding, wherein the grounding surface is a surface, on which the semiconductor element is mounted, having slit-like regions formed by clipping plating on the package like dotted lines.

According to a second aspect of the present invention, there is provided a semiconductor package for radio frequency, in which slit-like regions formed by clipping plating like dotted lines on the package to prevent disconnections of wires caused by extrusion of a jointing material at a time of mounting a semiconductor element; and an area in contact with the semiconductor element positioned just below the element and areas in contact with the wires for grounding are arranged with extremely short intervals.

According to a third aspect of the present invention, there is provided a semiconductor package for radio frequency having a grounding surface, to which grounding electrodes of a semiconductor element are connected by wires for grounding, in which the grounding surface is a surface, on which the semiconductor element is mounted, including metallic plates attached by a conductive jointing material thereto in order for enabling the wires for grounding to be connected to the grounding electrodes of the semiconductor element.

According to a fourth aspect of the present invention, there is provided a semiconductor package for radio frequency, in which metallic plates are provided to prevent disconnections of wires caused by extrusion of a jointing material at a time of mounting a semiconductor element on the package; and a grounding area positioned just below the semiconductor element and areas for grounding the wires in the package are arranged with extremely short intervals.

According to a fifth aspect of the present invention, there is provided a semiconductor package for radio frequency having a grounding surface, to which grounding electrodes in a semiconductor element are connected by wires for grounding, in which the grounding surface is a surface, on which the semiconductor element is mounted; and the grounding surface includes dielectric members shaped like a rectangular with more frontage than depth and the wires for grounding are connected to the grounding surface on outer sides of the dielectric members being opposite to the semiconductor element.

According to a sixth aspect of the present invention, there is provided a semiconductor package for radio frequency, in which dielectric members shaped like a rectangular with more frontage than depth are provided to prevent disconnections of wires caused by extrusion of a jointing material at a time of mounting a semiconductor element; and a grounding area positioned just below the semiconductor element and areas for grounding the wires in the package are arranged with extremely short intervals.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 8 is a perspective view of a part of the conventional semiconductor package for radio frequency with indications of electric current flows.

DETAILED DESCRIPTION OF THE PREFERRED EMBODIMENTS

A detailed explanation will be given of preferred embodiments of the present invention in reference to FIGS. 1 through 8 as follows, wherein the same numerical references are used for the same or the similar portions and description of these portions is omitted.

Embodiment 1

Embodiment 1 of the present invention will be described in reference of FIGS. 1 and 2.

Figure 1:
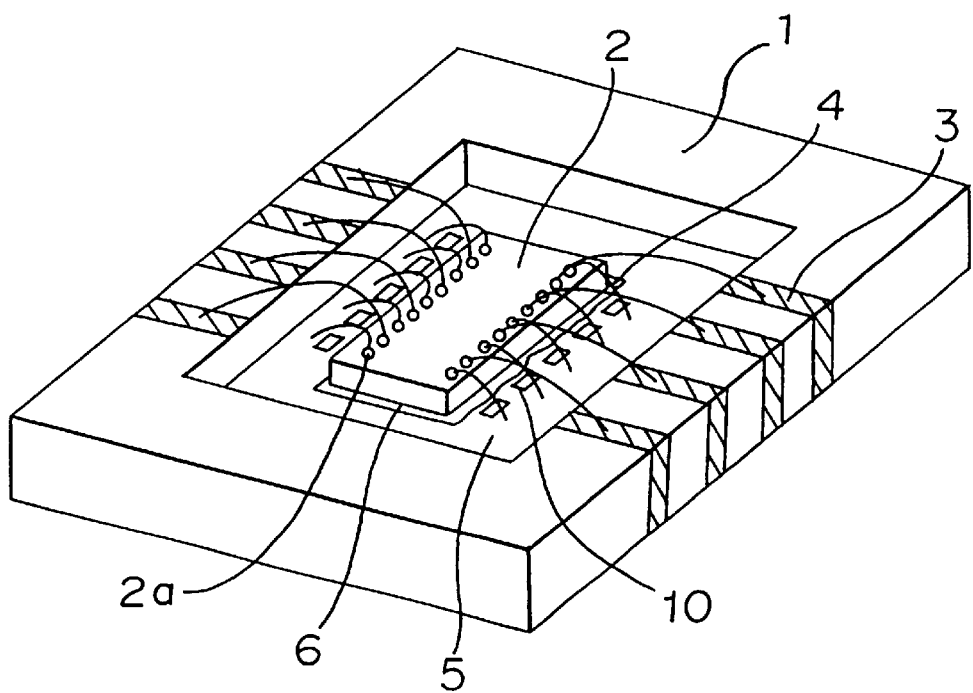
FIG. 1 schematically shows a semiconductor package for radio frequency according to Embodiment 1 of the present invention.
Figure 2:
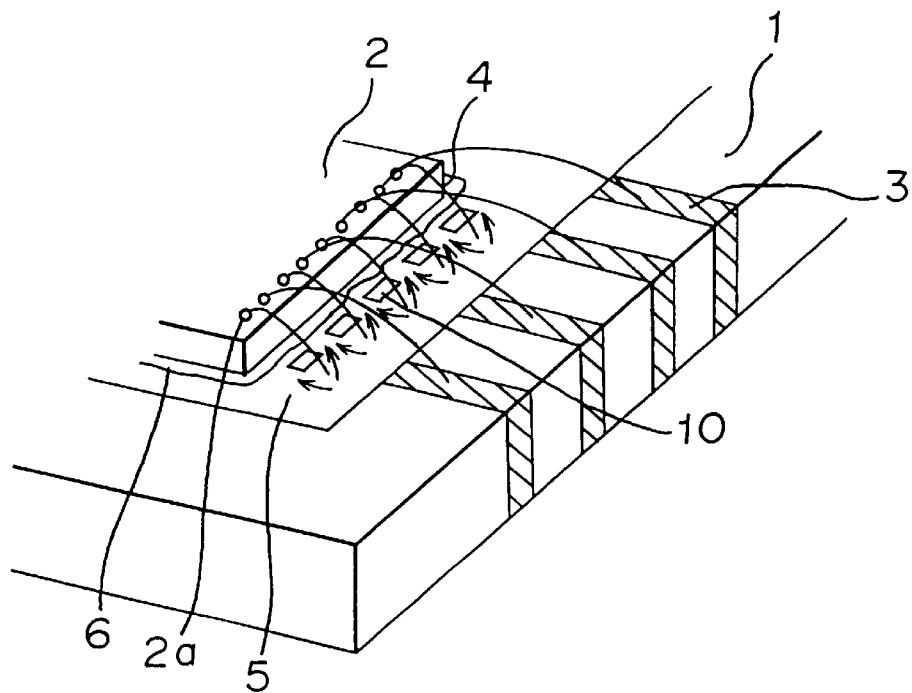
FIG. 2 is a perspective view of a part of the semiconductor package for radio frequency with indications of electric current flows according to Embodiment 1 of the present invention.

FIG. 1 is a perspective view for schematically showing a semiconductor package for radio frequency according to Embodiment 1 of the present invention.

In FIG. 1, numerical reference 1 designates a ceramic package; numerical reference 2 designates a semiconductor element operated under 5.0 GHz or more, such as GaAs monolithic microwave integrated circuit (GaAs-MMIC); numerical reference 2a designates electrodes for grounding of the semiconductor element 2; numerical reference 3 designates inner lead wires for electrically connecting an outer circuit to the semiconductor element; numerical reference 4 designates Au wires for grounding; numerical reference 5 designates a grounding area as a contact surface of the package formed by metallizing a ceramic; numerical reference 6 designates a jointing material for connecting the semiconductor element 2 to the package 1; and numerical reference 10 designates slits arranged like dotted lines provided to prevent disconnections of wire bondings between the electrodes for grounding of the semiconductor element 2 and the rounding area 5 of the package by the Au wires, wherein the slits 10 are formed by clipping plating on the grounding surface 5, has a length of about 0.3 mm and a width of about 0.15 mm per one slit, and are covered by a ceramic or a metal on which solder does not run.

As described, in the semiconductor package for radio frequency according to Embodiment 1, because the slits are arranged like dotted lines to prevent disconnections of wire bonding caused by extrusion of the jointing material 6, it is possible to joint the grounds of the semiconductor element to a ground surface 5 of the package with extremely short bonding wires or connect a ground area positioned just below a semiconductor element to areas bonded to a ground surface 5 of the package within extremely short intervals as indicated by arrows shown in FIG. 2, whereby components of inductance causing deterioration of radio frequency properties are greatly suppressed to be low.

Embodiment 2

Figure 3:
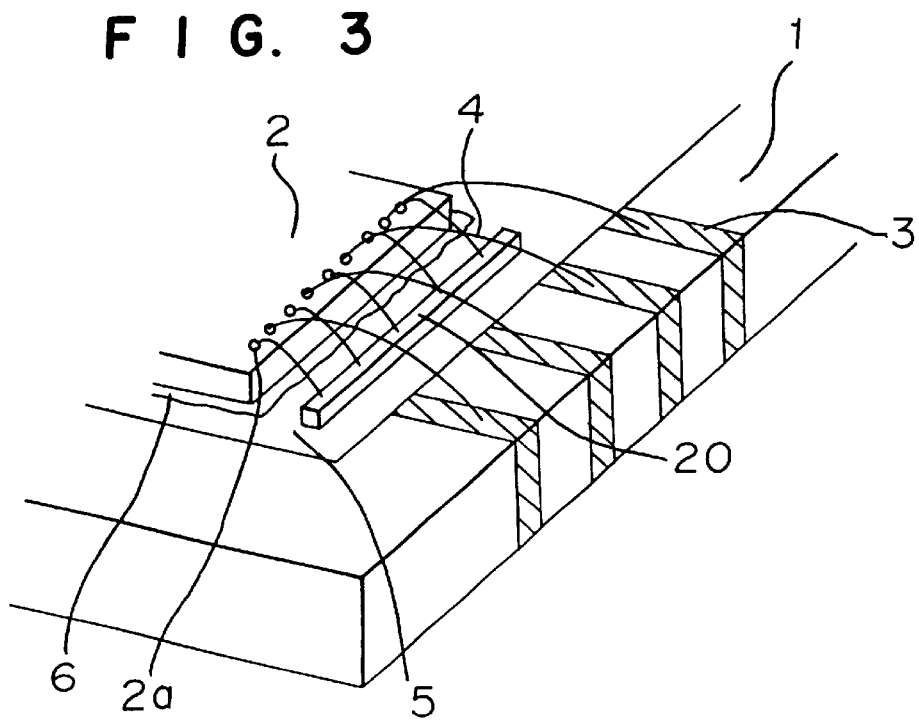
FIG. 3 is a perspective view of a part of a semiconductor package for radio frequency according to Embodiment 2 of the present invention.

Aims of Embodiment 2 are the same as those of Embodiment 1. As shown in FIG. 3, metallic plates 20 are respectively soldered or jointed by a conductive resin on both sides of a semiconductor element 2, and grounds of the semiconductor element 2 is bonded to these metallic plates 20. A material of the metallic plates 20 is an alloy of Fe—Ni—Co or Cu with final surface treatment of vapor deposition of Au or plating of Au. The metallic plates 20 has a width of about 0.3 mm, a length of about 2.5 mm, and a height of about 0.2 mm to prevent running of solder from the semiconductor element 2. Simultaneously, by the metallic plates 20 bonded to the semiconductor element 2 by bonding wires makes intervals of connections between the semiconductor element 2 and a ground surface of package extremely short. Therefore, components of inductance are substantially lowered and deterioration of properties of the semiconductor element can be prevented.

Embodiment 3

Figure 4:
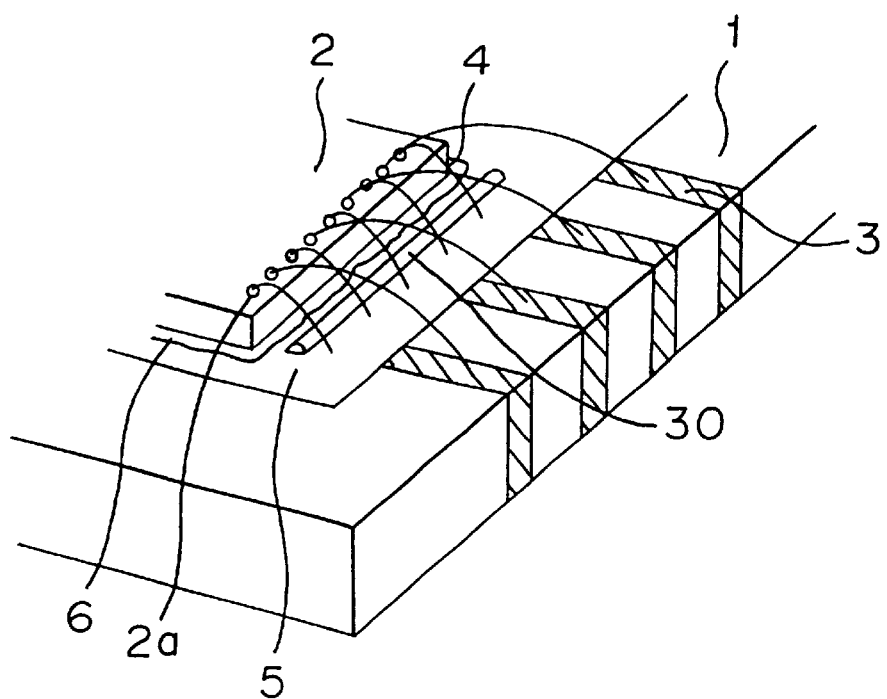
FIG. 4 is a perspective view of a part of a semiconductor package for radio frequency according to Embodiment 3 of the present invention.
Figure 5:
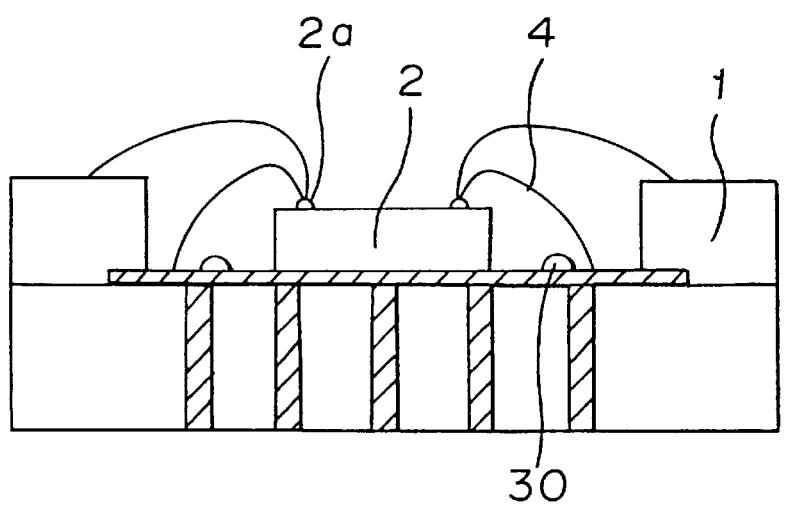
FIG. 5 schematically shows the semiconductor package for radio frequency in section according to Embodiment 3 of the present invention.
Figure 6:
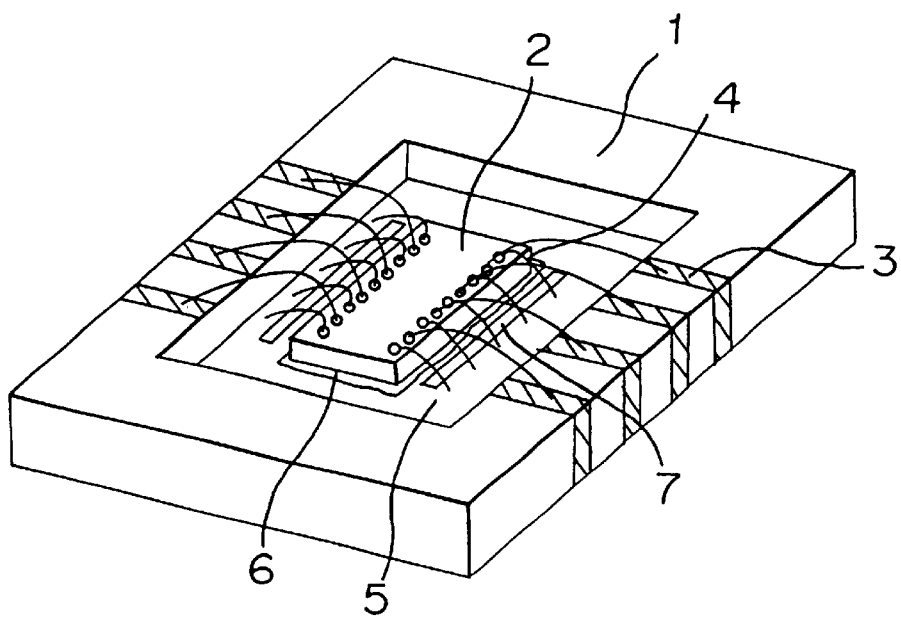
FIG. 6 schematically shows a perspective view of a conventional semiconductor package for radio frequency.
Figure 7:
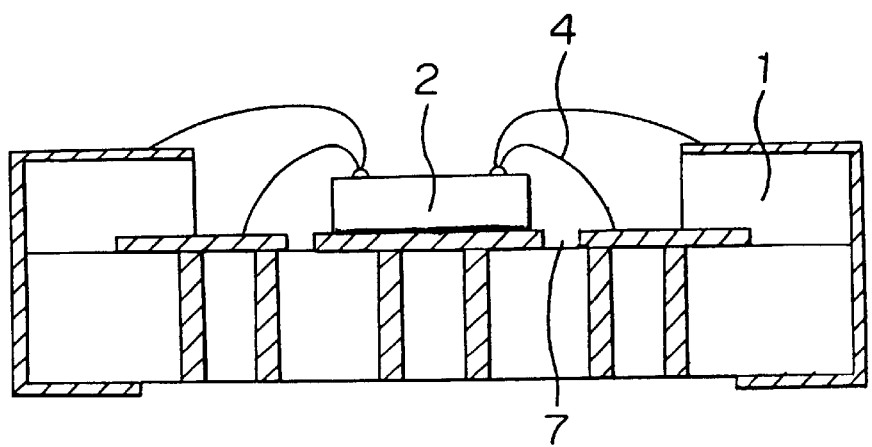
FIG. 7 schematically shows the conventional semiconductor package for radio frequency in section.

Aims of Embodiment 3 is the same as those of Embodiment 1. As shown in FIG. 4, dielectric members 30 are provided on both sides of a semiconductor element on a ground surface 5 of package. The dielectric members 30 have a width of about 0.2 mm, a length of about 2.5 mm, and a height of about 30 through 40 μm. Because a metallic surface is positioned just below the dielectric members 30, it is possible to connect a surface region positioned just below the semiconductor element to an area bonded to the ground surface of the package with extremely short intervals, whereby components of inductance causing deterioration of radio frequency properties are substantially lowered. Further, because the dielectric members 30 are shaped like a dam as shown in FIG. 4, running of a jointing material of not only solders but also resins can be certainly prevented.

Although, in Embodiment 3, a case that the dielectric members are shaped like a dam, these may be slits like dotted lines as described in Embodiment 1 or in a rectangular shape with more frontage than depth as described in Embodiment 2, wherein effects similar to those in Embodiment 3 can be demonstrated.

The first advantage of a semiconductor package for radio frequency according to the present invention is that running of jointing material for a semiconductor element is prevented, and a grounding area positioned just below the semiconductor element and an area bonded to a grounding surface of the package are connected with extremely short distances to thereby substantially lower components of inductance causing deterioration of radio frequency properties.

The second advantage of a semiconductor package for radio frequency according to the present invention is that disconnections of wire caused by extrusion of a jointing material at a time of mounting a semiconductor element on the package can be prevented, and a grounding area positioned just below the semiconductor element and a grounding area of the wires on the package are arranged with extremely short intervals.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor package for radio frequency having a grounding surface to which grounding electrodes of a semiconductor element mounted on the package are connected by grounding wires, wherein regions shaped like slits are formed on the grounding surface by clipping plating on the grounding surface to be like dotted lines.

2. The semiconductor package for radio frequency according to claim 1, wherein the regions shaped like slits formed by clipping the plating to be like dotted lines prevent disconnections of wires caused by extrusion of a jointing material at a time of mounting the semiconductor element on the package; and a grounding area positioned just below the semiconductor element and areas in contact with the grounding wires respectively of the package are arranged with extremely short intervals.

3. The semiconductor package for radio frequency according to claim 2, wherein the package is made of at least ceramic.

4. A semiconductor package for radio frequency having a grounding surface to which grounding electrodes of a semiconductor element mounted on the package are connected by grounding wires, comprising:

metallic plates jointed to the grounding surface of the package by a conductive jointing material, wherein the grounding wires connecting the grounding electrodes of the semiconductor element to the grounding surface of the package are connected to said plates.

5. The semiconductor package for radio frequency according to claim 4, wherein the metallic plates prevent disconnections of wires caused by extrusion of the jointing material at a time of mounting the semiconductor element on the package; and a grounding area positioned just below the semiconductor element and grounding areas of the package are arranged with extremely short intervals.

6. The semiconductor package for radio frequency according to claim 5, wherein the package is made of at least ceramic.

7. A semiconductor package for radio frequency having a surface for grounding to which electrodes for grounding of the semiconductor element mounted on the package are connected by wires for grounding, wherein dielectric members shaped like a rectangle with more frontage than depth are formed on the grounding surface of the package; and the grounding wires connecting the grounding electrodes of the semiconductor element to the grounding surface of the package are connected on outer sides of said dielectric members opposite to the semiconductor element.

8. The semiconductor package for radio frequency according to claim 7, wherein said dielectric members shaped like a rectangular with more frontage than depth prevent disconnections of wires caused by extrusion of a jointing material at a time of mounting the semiconductor element; and a grounding area positioned just below the semiconductor element and grounding areas of the package are arranged with extremely short intervals.

9. The semiconductor package for radio frequency according to claim 8, wherein the package is made of at least ceramic.

* * * * *